US006304444B1

United States Patent
Combs et al.

(10) Patent No.: US 6,304,444 B1
(45) Date of Patent: Oct. 16, 2001

(54) UNDERGROUND CENTRALIZED POWER SUPPLY/BATTERY VAULT

(75) Inventors: Charles D. Combs, Buffalo, MO (US); Larry Ernest Cox, Colleyville, TX (US); George L. Hanlon, Monroe, CT (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/643,582

(22) Filed: Aug. 22, 2000

Related U.S. Application Data

(60) Provisional application No. 60/150,615, filed on Aug. 24, 1999.

(51) Int. Cl.[7] ................................................. H05K 7/20
(52) U.S. Cl. .................. 361/695; 165/80.3; 174/16.1; 361/678
(58) Field of Search ............................. 174/16.1, 15.1, 174/15.3; 307/150; 363/141; 165/80.3, 121–126, 104.33; 429/57, 148, 149, 175, 176; 361/676–678, 688–690, 691, 694, 695, 696, 701, 724; 454/184; 312/236

(56) References Cited

U.S. PATENT DOCUMENTS

| 3,360,752 | * | 12/1967 | Uptegraff . |
| 6,006,944 | * | 12/1999 | Machledt ........................... 220/567.1 |
| 6,164,369 | * | 12/2000 | Stoller ............................... 165/104.33 |

* cited by examiner

Primary Examiner—Gerald Tolin

(57) ABSTRACT

An underground equipment vault for power and electronic equipment includes an airflow system in combination with an above ground forced air source. The airflow courses through separate first and second chambers including a first chamber for power supplies and a second chamber for energy storage equipment. This airflow, sequentially traversing both chambers, dissipates heat from the equipment and further dispels hydrogen gases from the batteries to the outside air. An airflow system, utilizing fans, provides positive pressure to force the desired airflow through the chambers. The vault is closed with a dual lid structure to supply supporting strength and also supply a secure seal for closing the vault. The dual construction provides an insulating space for further insulating the vault from ambient conditions.

9 Claims, 2 Drawing Sheets

UNDERGROUND CENTRALIZED POWER SUPPLY/BATTERY VAULT

CROSS REFERENCE TO RELATED APPLICATIONS

This application claims priority to Provisional Application Ser. No. 60/150,615, filed on Aug. 24, 1999, the content of which is incorporated by reference herein.

FIELD OF THE INVENTION

This invention relates to temperature control of enclosed electronic and energy storage equipment. It is particularly concerned with temperature control of power supplies and batteries enclosed in underground vaults. It is also concerned with equipment vaults for application in hybrid fiber cable networks.

BACKGROUND OF THE INVENTION

Communication networks comprising hybrid fiber coaxial (HFC) transmission lines are being used extensively because of their ability to provide a wide range of services from broadcast entertainment, high speed internet access, interactive multimedia and sophisticated telephony services. Provision of high quality service requires that power supplies and energy sources be located in the field close to the HFC network. Since the number of available sites for locations is limited power equipment, suitable for several HFC sites, must be collocated, to limit the total number of needed sites.

Power equipment and electronic equipment, both switching and processing, are fundamental components of communication networks. While they differ in form and function they all universally dissipate heat which must be accommodated by some form of heat exchange. Often the power equipment, as indicated, includes power supplies and batteries. Batteries make the additional requirement of accommodating the hydrogen gases that are exhausted.

In large spacious enclosures such heat may be readily dissipated in a plenum. Heat absorbed by the air plenum is transferred to heat exchangers by providing ample space for large quantities of air to circulate about a heat sink. The system generally operates because the enclosure is generally well positioned and sufficiently large in size to easily accommodate the desired heat transfer so that heat may be safely dissipated from the equipment.

Spacious arrangements that readily permit large heat transfers from heat generating equipment are not always available however. Government regulations often restrict the size and location of containers containing the needed electrical equipment. In many cases the equipment housing must be out of or nearly out of public view or perception and, hence, available space for the equipment and air plenum is very constrained.

The heat dissipating and hydrogen outgassing plenum volume as constrained by these requirements may be unrelated to the equipment heat dissipation needs. These may be location requirements; size and shape requirements and other requirements related to neighborhood appearance and esthetics.

It seems desirable, for these reasons, to locate such a container under ground. Several problems arise from using an underground location. These problems include, as indicated above, heat dissipation of the enclosed power supplies, removal of hydrogen gasses generated by the enclosed batteries and the intrusion of water into the container. The restricted size alone may not accommodate the heat dissipation requirements of the equipment. As such the operating lifetime of the equipment is severely reduced.

It is a dual prerequisite to conform to these regulatory requirements and to engineering requirements to effectively provide for outgassing and heat dissipation of the equipment.

SUMMARY OF THE INVENTION

An exemplary embodiment of an underground equipment vault for power supplies and energy storage equipment includes an airflow system in combination with an above ground forced air source and sink. The airflow courses through separate first and second chambers including a first chamber including the power supplies and a second chamber including the batteries. This airflow traverses both chambers in sequence and firstly dissipates heat from the power supplies equipment and subsequently assimilates hydrogen gases from the batteries. The mixed heated air and assimilated gasses are exhausted into the outside air. An airflow system, utilizing sequencing air passages and fans, provides positive convective pressure to force the desired airflow sequentially through the chambers.

The vault, in the exemplary embodiment, is closed with a dual lid with one lid of the dual structure primarily supplying supporting strength and the other lid supplying a seal for closing the vault. This dual lid structure advantageously provides an insulating space for further insulating the vault from ambient conditions.

DETAILED DESCRIPTION

Figure 1:
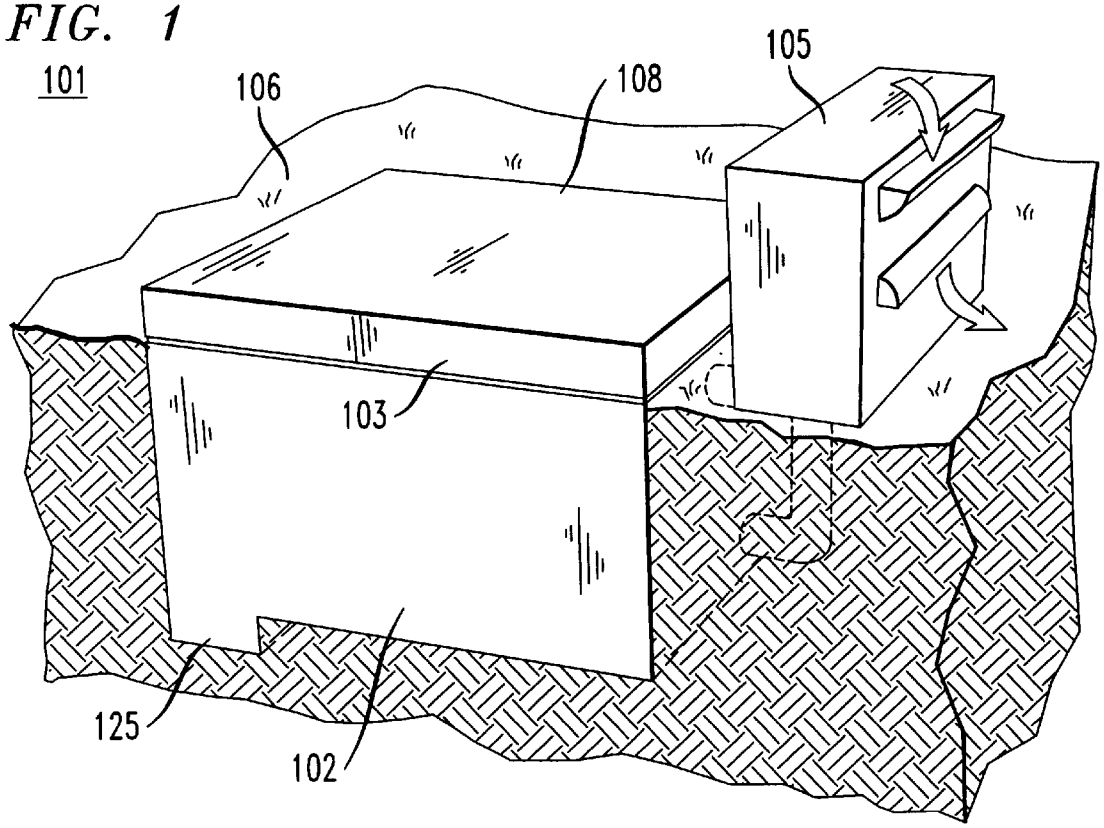
FIG. 1 is a pictorial schematic of an equipment embodying principles of the invention.

An exemplary equipment vault 101 including an adjacent control module, shown in schematic pictorial form in FIG. 1, has the shape of two adjacent or joined parallelepipeds. One component is the main vault 102 with a lid 103 providing a top surface 108 and having an interior plenum contains electrical equipment including power supplies and batteries. A smaller auxiliary unit 105, immediately adjacent (i.e., or attached to) the main vault 102, is a control center module including air handling equipment to provide forced air convection within the vault 102.

Vault 102 is placed in the ground 106 so that only its lid 103 is exposed to solar radiation and ambient air. Lid 103 provides entry to the vault 102 for maintenance, but is normally sealed so that the vault with exception of the air handling equipment is sealed from outside contaminants such as dust and other particles during operation of the power and energy equipment. With immersion of vault 102 in the earth, having only the lid 103 exposed to view, the resulting visible effect of the vault is greatly minimized. The vault 102 advantageously includes a sump 125, which collects moisture permitting pumping it out of the vault.

This earth insertion location advantageously stabilizes the temperature of the vault and hence the temperature of its enclosed equipment. It is not uncommon for air temperature in the United States to vary by 100 degrees within the course of a year while the earth temperature is very stable and tends to substantially remain in the fifties (i.e., a midrange) most of the year. This earthen (i.e., sub-terranium) location of the vault in combination with the active cooling methods, described herein, tends to stabilize the equipment operating temperature thereby extending the life of this equipment. With the stabilizing influence of the surrounding earth the cooling technique is enhanced and need not be unduly complex. As such its (i.e., the equipment) reliability is greatly increased.

Figure 2:
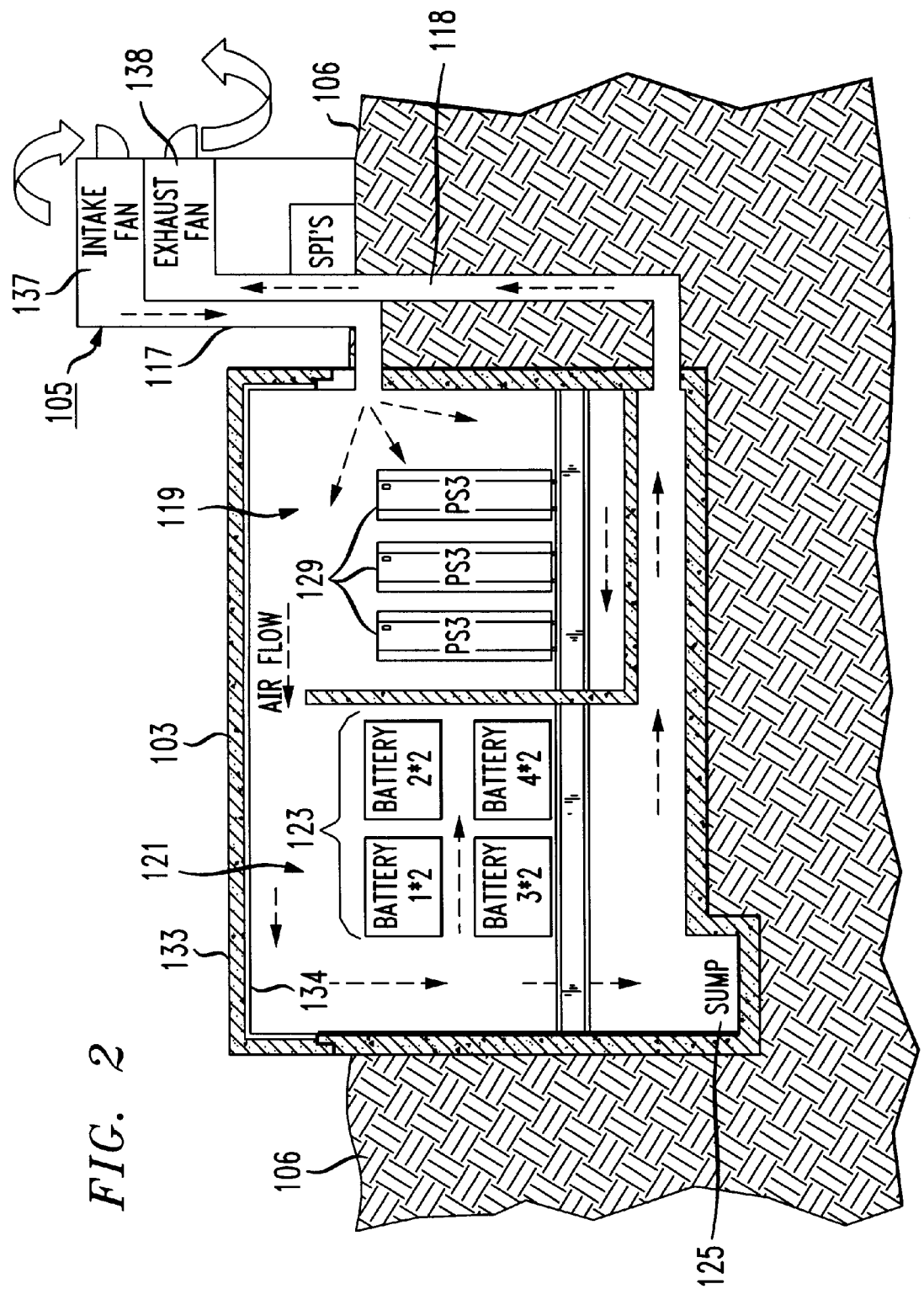
FIG. 2 is a schematic cross sectional view of an equipment vault, shown in the FIG. 1, embodying principles of the invention.

As shown by FIG. 2 the lid 103 has two substantially parallel outer (top) and inner (bottom) planar surfaces 133 and 134 that are separated to provide a plenum between the two surfaces for enhancing insulation of the interior plenum from the outside ambient atmosphere. The lid insulation protects the vault interior from a substantial temperature increase due to radiation energy of the sun impinging upon the lid. These dual surfaces additionally interactively provide for both a secure seal and for added mechanical strength of the lid structure. This dual structure due to the improved seal reduces the entry of surface water into the vault.

The vault 102 is constricted of a material that may easily be sealed and which is durable for extended sub-terranium use during extended periods of time. Such a material, for example, may be a concrete/composite or a similar material with desirable strength and thermal proprieties.

The control center module 105 is positioned adjacent to and is adjoined to the main vault 102. It includes, as shown in the FIG. 2, both an inlet fan 137 (i.e., air pressure source) and an exhaust fan 138 (i.e., air pressure sink) associated with inlet and exhaust passages 117 and 118 connected to provide inlet air to air passages in the vault and air exhaust for the air passages in the vault. The inlet and outlet fans may have associated filters to prevent entry of dirt, dust and other contaminants into the interior of the vault.

While not specifically shown the control module 105 may include security features to monitor effective closure of the lid and to check for build up of hydrogen gas and collection of water in the sump. Embodiment of these features is readily apparent to those skilled in the art and need not be disclosed in detail.

As shown the air in the first chamber 119, containing power supplies 129, is supplied directly from the inlet passage 117. This air is exhausted into the subsequent second chamber 121 containing the batteries 123. This airflow is exhausted out of the second chamber and past, but not reintroduced into, the first chamber into the exhaust airflow passage 118. This avoids passing hydrogen gas infected air into an enviromnent of possible ignition elements.

In a particular exemplary embodiment the vault may exceed five feet (i.e., 64 inches) in length and one and three-quarters feet (i.e., 21⅝inches) in width. Overall height is over two and one-half feet (i.e., 32 inches) with a ground penetration of over two feet (i.e., 26 inches). The lid structure extends one-half foot above the ground (i.e., 6 inches). The vault includes three 22 amp power supplies in chamber one and up to eight batteries in chamber two.

While a particular exemplary embodiment has been disclosed herein it is to be understood that many variations may be implemented by those skilled in the art without departing from the spirit and scope of the invention.

What is claimed is:

1. A vault for housing heat dissipating electrical equipment in an environment substantially subterranean, comprising:

a container having at least one side panel open exposing the interior of the container and the electrical equipment being inserted into that interior;

a lid for fitting on top of and closing the container;

a heat exchange apparatus for removing heat generated by the electrical equipment, for removing gaseous discharges and discharging it to an ambient environment outside of the container; the heat exchange apparatus including:

a first chamber containing electrical power supply equipment generating heat;

a second chamber containing electrical power source equipment generating gases; and a continuous air flow path traversing the first and second chamber and providing for an inlet of ambient atmosphere air and exhaustion of airflow from the path into the ambient atmosphere air.

2. The vault of claim 1, wherein:

the lid comprises two components; a first lid component for sealing the vault and a second lid component for enhancing mechanical strength of the vault; and an insulation enhancing space between the two lid components.

3. The vault of claim 1, wherein:

an air pressure source for providing an air inlet under pressure is included.

4. The vault of claim 1, wherein:

an air pressure sink for providing an air outlet under pressure is provided.

5. The vault of claim 3, wherein:

the first and second chambers are connected in sequence such that with application of the air pressure source airflow flows from the first chamber into the second chamber.

6. The vault of claim 4, wherein:

the first and second chambers are connected in sequence such that with application of the air pressure sink airflow flows out of the second chamber including air drawn from the first chamber.

7. The vault of claim 1, wherein:

the vault includes a sump positioned to collect moisture accumulating within the vault.

8. The vault of claim 3, wherein:

the air pressure source includes an air filtering mechanism.

9. The vault of claim 4, wherein:

the air pressure sink includes an air filtering mechanism.

\* \* \* \* \*